United States Patent [19]

Kizawa et al.

[11] Patent Number: 4,937,116

[45] Date of Patent: Jun. 26, 1990

[54] LIGHTSAFE MASKING FILM

[75] Inventors: Kinichi Kizawa, Koshigaya; Naohiko Kiryu, Urawa, both of Japan

[73] Assignee: Somar Corporation, Japan

[21] Appl. No.: 312,184

[22] Filed: Feb. 21, 1989

[30] Foreign Application Priority Data

May 31, 1988 [JP] Japan ................................. 63-135136

[51] Int. Cl.$^5$ .......................... B32B 5/16; B32B 19/02
[52] U.S. Cl. ...................................... 428/40; 428/329; 428/333; 428/343
[58] Field of Search ................. 428/40, 329, 333, 354, 428/343, 204, 207, 42; 106/460

[56] References Cited

U.S. PATENT DOCUMENTS

| | | | |
|---|---|---|---|
| 3,352,728 | 11/1987 | Stein et al. | 156/3 |
| 3,619,335 | 11/1971 | Bryan | 161/1 |
| 3,810,812 | 5/1974 | Koenig | 428/204 |
| 3,892,900 | 7/1975 | Shima et al. | 428/40 |
| 4,567,129 | 1/1986 | Held | 430/279 |
| 4,681,784 | 7/1987 | Ebara et al. | 428/40 |

FOREIGN PATENT DOCUMENTS

| | | |
|---|---|---|
| 0076565 | 4/1983 | European Pat. Off. . |
| 2019723 | 10/1970 | Fed. Rep. of Germany . |
| 2206866 | 6/1974 | France . |

OTHER PUBLICATIONS

Solid State Technology, Jun. 1973, vol. 6, No. 6, "Properties of Iron Oxide Films for Photomask Applications", pp. 33–36.

*Primary Examiner*—George F. Lesmes
*Assistant Examiner*—J. Davis
*Attorney, Agent, or Firm*—Lorusso & Loud

[57] ABSTRACT

A lightsafe masking film for use in masking a roomlight film is disclosed which comprises a substrate, and a transparent, lightsafe layer peelably provided over the surface of said substrate and containing finely divided particles of an inorganic metal compound capable of blocking ultraviolet light to which the roomlight film is sensitive.

8 Claims, No Drawings

LIGHTSAFE MASKING FILM

This invention relates generally to a lightsafe masking film and, more specifically, to a composite, lightsafe masking film to be used as an original copy having a transparent pattern in the photomechanical reproduction process.

One known lighsafe masking film of this type is composed of a plastic film substrate and a peelable, lightsafe layer provided thereon. When a desired cutting line is formed on the lightsafe layer manually or with a suitable automatic cutting device and when the cut portion is removed by peeling, there is left a desired transparent pattern on the masking film.

The lightsafe layer contains a lightsafe substance. As the lightsafe substance is generally used an organic colorant capable of being dissolved in an organic solvent.

Organic colorants have generally a poor resistance to light and tend to be degraded upon exposure to light for a long period of time. Additionally, in order to obtain a sufficient light-blocking effect, it is necessary to use them in a large amount. Thus, a conventional lightsafe masking film using such an organic colorant encounters problems of deterioration of its transparency, light-blocking property or the like properties and of the occurrence of separation and bleeding of the colorant from the surface of the film.

The present invention is contemplated to solve the problem of the conventional lightsafe masking film. In accordance with the present invention, there is provided a lightsafe masking film comprising a transparent substrate, and a transparent, lightsafe layer peelably provided over the surface of said substrate and containing finely divided particles of an inorganic metal compound capable of blocking ultraviolet light.

The present invention will now be described in detail below.

Lightsafe masking film according to the present invention is comprised of a transparent substrate formed of a plastic material having provided thereon a peelable, transparent, lightsafe layer.

Any plastic material conventionally used as a transparent substrate in known lightsafe masking films can be used for the purpose of the present invention. Synthetic resin films, semisynthetic resin films and laminated films thereof may be used as the substrate. Illustrative of suitable synthetic resin films are those formed of a polyester such as polyethylene terephthalate or polybutylene terephthalate, an aromatic polyamide, an aliphatic polyamide, a polyolefin such as polyethylene or polypropylene, a polystyrene, a polycarbonate, a polyvinyl chloride and a polyvinylidene chloride. Illustrative of a suitable semisynthetic resin film is that formed of a cellulose acetate. Examples of the laminated films include those using a combination of synthetic resin layers, a combination of synthetic resin and semisynthetic resin layers, a combination of a cellulose layer and a synthetic resin layer and/or a semisynthetic resin layer. Above all, a polyethylene terephthalate film is an especially preferred substrate for reasons of excellent dimensional stability and excellent tensile strength and tearing strength. The thickness of the film is generally in the range of 20-300 μm, preferably 50-250 μm. Both stretched and non-stretched films may be used as the substrate.

The substrate is overlaid with a peelable, lightsafe layer generally composed of a binder and a lightsafe or light-shading substance. Any binder customarily used in lightsafe layer of known masking films may be used for the purpose of the present invention. Examples of the binder include a polyvinyl chloride, a polyvinylidene chloride, a polyvinyl acetate, a polyvinyl formal, a polyvinyl acetal (e.g. polyvinyl butylal), an acrylic resin, a polyamide resin, a polyacetal resin, a polyester resin, a phenol resin, a urea resin, a melamine resin, an alkyd resin, a polyurethane resin, a cellulose acetate resin, a polyvinyl alcohol, a copolymer of vinyl chloride (e.g. a vinyl chloride/vinyl acetate copolymer, a vinyl chloride/vinylidene chloride copolymer, a vinyl chloride/acrylic ester copolymer and a vinyl chloride/vinyl acetate/maleic acid copolymer), a copolymer of vinyl acetate (e.g. a vinyl acetate/ethylene copolymer), cellulose (e.g. nitrocellulose, acetyl cellulose, alkyl cellulose and acetylalkylcellulose), a diene-type rubber (e.g. an acrylonitrile/butadiene rubber), an olefin-type rubber (e.g. an acrylic rubber) and an urethane rubber. These binders may be used by themselves or in combination of two or more.

Above all, it is preferable to use as a binder a combination of a vinyl chloride/vinylidene chloride copolymer and a diene-type rubber or a combination of a vinyl chloride/vinyl acetate copolymer and a diene-type rubber. Especially preferred is a cojoint use of a vinyl chloride/vinylidene chloride copolymer and a nitrile rubber (an acrylonitrile/butadiene rubber) for reasons of freeness of the following defects from which a lightsafe layer using a combination of a vinyl chloride/vinyl acetate copolymer and a nitrile rubber suffers: (1) Too high a binding force between the lightsafe layer and the substrate. This causes difficulties in peeling off the lightsafe layer. More specifically, it becomes difficult to separate and raise an edge of a cut lightsafe layer from the substrate even if a knife is used. It is also difficult and time-consuming to peel off the layer with fingers holding the raised edge portion, while preventing deformation or breakage of the cut layer to be peeled off. (2) Susceptibility of the binding force of the layer to temperature and humidity.

When the combination of a vinyl chloride/vinylidene chloride copolymer and a nitrile rubber is used as the binder, the weight ratio of the former to the latter is generally 50:50 to 95:5, preferably 60:40 to 90:10. Too low a weight ratio below 50:50 causes an excessive increase of the binding strength between the layer and the substrate, a decrease of rigidity of the layer, an increased tendency to deform and an increase of the surface tackiness. On the other hand, when the weight ratio exceeds 95:5, the binding force becomes small and the layer becomes apt to be broken.

It is preferred that the vinyl chloride/vinylidene chloride copolymer have a vinyl chloride content of 60-95% by weight, more preferably 70-90% by weight, the balance being essentially vinylidene chloride. When the proportion of the vinylidene chloride exceeds 40% by weight, the resulting lightsafe layer becomes tacky. A proportion of the vinylidene chloride below 5% by weight is disadvantageous because the lightsafe layer becomes so rigid that it is apt to be cracked during peeling operation. The vinyl chloride/vinylidene chloride copolymer preferably has an average polymerization degree of 300-600, more preferably 400-500. Too high a polymerization degree in excess of 600 causes lowering of the solubility of the polymer so that it becomes difficult to prepare a coating liquid for the formation of the lightsafe layer. In addition, since the coating liquid becomes high in viscosity, it becomes difficult to form a uniformly coated lightsafe layer on the substrate. A polymerization degree of below 300 is also disadvantageous because the resulting lightsafe layer is weak and is apt to be broken during a peeling stage.

The nitrile rubber to be used in conjunction with the above copolymer is composed of butadiene and acrylonitrile as its main components. An acrylonitrile/butadiene rubber, an acrylonitrile/butadiene copolymer and a terpolymer of acrylonitrile/butadiene/carboxyl group-containing monomer are illustrative of such nitrile rubber. The acrylonitrile content of the nitrile rubber is preferably 18–53% by weight, more preferably 25–43% by weight.

The lightsafe substance to be incorporated into the lightsafe layer is a fine particulate of an inorganic metal compound capable of absorbing UV rays. The metal compound may be, for example, a metal oxide, preferably an iron oxide, such as $Fe_2O_3$ or $Fe_3O_4$, or a titanium oxide such as $TiO_2$. The fine particulate preferably has an average particle size of 250 Å or less, more preferably 100 Å or less. For reasons of improved dispersibility, it is preferred that the surfaces of the fine particles of the metal compound be coated with a silicone oil or a surfactant. The content of the fine particulate in the lightsafe layer is preferably 2–20% by weight, more preferably 2.5–15% by weight.

It is preferred that the fine particulate of the inorganic metal compound be used together with a yellow colorant, since the light-shading or light-blocking property of the lightsafe layer can be further improved. Illustrative of suitable yellow colorants are Savinyl Yellow RLS (C.I. Solvent Yellow 83), Aizen SOT Yellow-1 (C.I. Solvent Yellow 56), Mihara Oil Yellow 3G, Neo Zapon Yellow 081 (C. I. Solvent Yellow 79), Orsaol Yellow 2GLN (C.I. Solvent Yellow 88), Savinyl Yellow 2GLS (C.I. Solvent Yellow 79), Vali Fast Yellow 4120 (C.I. Solvent Yellow 82), Vali Fast Yellow 2110 (C.I. Solvent Yellow 79), Vali Fast Yellow 1101, Vali Fast Yellow 1105, Mihara OIl Yellow 5G, Mihara Oil Yellow 10G, Kayaset Yellow K-RL, Oil Yellow 101 (C.I. Solvent Yellow 34), Oil Yellow 107 (C.I. Solvent Yellow 42), Oil Yellow D (C.I. Solvent Yellow 93), Neo Super Yellow C-131 (C.I. Solvent Yellow 21), and Neo Super Yellow C-132 (C.I. Solvent Yellow 151). Other yellow colorants may be of course usable for the purpose of the present invention. These yellow colorants may be used singly or in combination of two or more. The amount of the yellow colorant is generally 1–10% by weight, preferably 2–6% by weight based on the weight of the lightsafe layer. By the use of the yellow colorant in conjunction with the UV-absorbing metal compound, the lightsafe layer can substantially perfectly block light having a wavelength of 500 nm or less.

The lightsafe layer may further contain one or more additives, such as a filler, a leveling agent, a blocking-preventing agent and a plasticizer, used in conventional masking films, if desired. As the filler may be used fine particulate of a cross-linked polystyrene, a benzoguanamine-formaldehyde condensation product, a nylone (e.g. 6,6-nylone, 6-nylone or 12-nylone), a silicone resin, a crystalline cellulose, a phenolformaldehyde resin, a fluororesin, a polyethylene resin or an acrylic resin. Of these fillers, the use of polystyrene beads is particularly preferred, because it is effective in improving homogeneity of a coating composition for the formation of the lightsafe layer, in improving peelability of the lightsafe layer from the substrate while maintaining desired bonding therebetween, in suppressing reflection of light on the surface of the lightsafe layer, and in reducing the surface tackiness of the lightsafe layer. The filler generally has a particle size of 0.5–20 μm, preferably 2–15 μm.

The lightsafe layer may be prepared by any known manner such as by applying a coating composition containing the above ingredients on the surface of the substrate. A solvent such as an alcohol, an ester, a hydrocarbon, a halogenated hydrocarbon, a ketone or the like organic solvent can be used for the formation of the coating composition. The lightsafe layer generally has a thickness of 10–50 μm, preferably 20–40 μm.

It is possible to provide a pressure sensitive adhesive layer between the substrate and the lightsafe layer so that the resulting masking film may permit the reuse of a cut lightsafe layer, peeled off from the substrate, for resticking. Such a adhesive layer is formed of a synthetic resin adhesive such as an acrylate ester copolymer, a saturated polyester or a polyurethane, or a rubber adhesive such as a natural rubber, a chloroprene rubber, isoprene rubber or a nitrile rubber.

When such a pressure sensitive adhesive layer is provided between the substrate and the lightsafe layer, it is preferred that the lightsafe layer be comprised of (A) nitrile rubber, (B) nitrocellulose, (C) plasticizer and (D) the lightsafe csubstance as mentioned above, for reasons of improved surface nontackiness.

The nitrile rubber (A) is, for example, a copolymer of acrylonitrile and other copolymerizable monomer, such as a copolymer of acrylonitrile and butadienen or a terpolymer of acrylonitrile, butadiene and a carboxyl group-containing monomer, and preferably has an acrylonitrile content of 19–51% by weight. The nitrile rubber imparts suitable adhesiveness and suitable peelability to the lightsafe layer.

The nitrocellulose (B) serves to function as a tackiness reducing agent in cooperation with the nitrile rubber. The nitrocellulose having a nitrogen content of 10.7–12.2% by weight is preferably used.

The plasticizer (C) serves to improve the flexibility of the lightsafe layer so that the layer can be peeled off without breakage or damage and can be reused for resticking. Examples of such plasticizers include fatty acid esters, preferably those having a molecular weight of 300–500, trimellitic acid esters, preferably those having a molecular weight of 500–700, epoxidized fats and fatty oils (glycerides), preferably those having a molecular weight of about 300–1300, and epoxidized fatty acid esters (non-glycerides), preferably those having a molecular weight of about 300–1300. Illustrative of suitable plasticizers are di(butoxyethoxyethyl) adipate, trioctyl trimellitate, epoxidized soybean oil, epoxidized linseed oil, methyl epoxystearate, butyl epoxystearate, octyl epoxystearate and di(2-ethylhexyl) epoxyhexahydrophthalate. These plasticizers can be used singly or in combination of two or more.

Above all, the use of di(butoxyethoxyethyl) adipate or epoxidized soybean oil is especially preferred. The use of di(butoxyethoxyethyl) adipate in conjunction with epoxidized soybean oil or epoxidized linseed oil is also particularly desired. In such a cojoint use, the epoxidized soybean oil or epoxidized linseed oil is used in an amount about 0.5–5 times the weight of the di(butoxyethoxyethyl) adipate.

The lightsafe masking film according to the present invention may be suitably used for the masking of a roomlight photosensitive material, such as of a silver halide-type or a photopolymer-type, which is sensitive to light with wavelengths of 400 nm or less, and other photosensitive materials.

The following examples will further illustrate the present invention.

EXAMPLE 1

A coating liquid having a composition shown in Table 1 was applied to the surface of a polyester film and the coated layer was dried to obtain a masking film having a lightsafe layer with a thickness of 40 μm. The masking film was then tested for its transparency and light blocking property. The light blocking property of the masking film was evaluated from the results of measurements of its photographic density D for UV light and of its spectral transmittance.

The photographic density D was measured by means of Macbeth TD-504 densitometer using Wratten #18A filter and is defined as follows:

$$D = -\log T$$

wherein T represents a light transmissivity which is a ratio of an intensity of the transmitted light to that of the incident light. The spectral transmittance was measured using Shimadzu UV-240 spectrophotometer. Evaluation of the transparency and light-blocking property was based on the following ratings:

5: very good
4: good
3: fair
2: bad
1: poor

The results are shown in Table 1, in which "maximum blocking wavelength" refers to a wavelength below which the transmittance is lower than 0.2% (absorbancy is greater than 2.7). Thus, for instance, a maximum blocking wavelength of 500 nm of a lightsafe masking film indicates that the film can substantially perfectly block light having a wavelength of 500 nm or less.

In Table 1, the master liquid (A), (B) and (C) are those having the following composition:

| Ingredient | Amount (part by weight) | | |
|---|---|---|---|
| | (A) | (B) | (C) |
| ½ H nitrocellulose | 22.3 | 22.3 | 22.3 |
| Nitrile rubber*1 | 12.8 | 12.8 | 12.8 |
| Plasticizer*2 | 2.3 | 2.2 | 2.3 |
| Silica*3 | 0.6 | 0.6 | 0.6 |
| Methyl ethyl ketone | 82.1 | 84.9 | 88.3 |

*1Nypol 1042, Nihon Zeon Inc.
*2Epoxidized fatty acid ester (Sansosizer E-4030, Shin Nihon Rika Inc.)
*3Syloid 74, Fuji-Devison Chemical Inc.)

EXAMPLES 2-5

Example 1 was repeated in the same manner as described except that the composition of the coating liquid was varied as shown in Table 1. The results are also shown in Table 1.

COMPARATIVE EXAMPLES 1 AND 2

Example 1 was repeated in the same manner as described except that the composition of the coating liquid was varied as shown in Table 1. The results are also shown in Table 1.

In Table 1, the lightsafe substances used were as follows:

$Fe_2O_3$: Fine particulate of $Fe_2O_3$ coated with monomolecular film of calcium stearate and having a $Fe_2O_3$ content of 45-50% by weight by weight and an average particle size of 50 Å

$Fe_3O_4$: Fine particulate of $Fe_3O_4$ having an average particle size of 200 Å

Red iron oxide (a): Average particle size of 2100 Å
Red iron oxide (b): Average particle size of 1500 Å
Colorant: Oil-soluble yellow colorant (Savinyl Yellow RLS)

TABLE 1

| Example | 1 | 2 | 3 |
|---|---|---|---|
| Master Liquid | | | |
| (A) | 120.1 | 120.1 | 120.1 |
| (B) | | | |
| (C) | | | |
| Toluene | 8.8 | 17.6 | 8.8 |
| Lightsafe substance | | | |
| $Fe_2O_3$ | 3.1 | 6.2 | |
| $Fe_3O_4$ | | | 3.1 |
| Red iron oxide (a) | | | |
| Red iron oxide (b) | | | |
| Colorant | | | |
| Photo graphic density (D) | 3.16 | 3.29 | 3.57 |
| Maximum blocking wavelength (nm) | 413 | 455 | 498 |
| Light blocking property | 4 | 4 | 5 |
| Transparency | 5 | 5 | 3 |

| Example | 4 | 5 | Comp. 1 | Comp. 2 |
|---|---|---|---|---|
| Master Liquid | | | | |
| (A) | | | 120.1 | 120.1 |
| (B) | 122.9 | | | |
| (C) | | 126.3 | | |
| Toluene | 8.8 | | 8.8 | 8.8 |
| Lightsafe substance | | | | |
| $Fe_2O_3$ | 3.1 | 3.1 | | |
| $Fe_3O_4$ | | | | |
| Red iron oxide (a) | | | 3.1 | |
| Red iron oxide (b) | | | | 3.1 |
| Colorant | 1.0 | 2.2 | | |
| Photographic density (D) | 3.15 | 3.16 | 2.29 | 2.73 |
| Maximum blocking wavelength (nm) | 503 | 515 | — | 568 |
| Light blocking property | 5 | 5 | 2 | 3 |
| Transparency | 5 | 5 | 1 | 1 |

As will be understood from the results shown in TAble 1, the use of red iron oxide with a large average diameter fails to give a transparent lightsafe layer (Comparative Examples 1 and 2). Furthermore, the lightsafe masking film containing the red iron oxide cannot effectively block UV light. On the other hand, the lightsafe masking films according to the present invention (Examples 1-5) have favorable transparency and light-blocking property and are advantageously used for, for example, contact exposure of a silver halide photosensitive film.

COMPARATIVE EXAMPLE 3

Example 1 was repeated in the same manner as described except that the coating composition used consisted of 126.3 parts by weight of the master liquid C and 10 parts by weight of the yellow colorant. The resulting masking film showed the bleeding of the yellow colorant on the surface of the lightsafe layer.

EXAMPLE 6

A polyethylene terephthalate film (thickness: 100 μm) was coated with a chloroprene-containing pressure sensitive adhesive layer (thickness after drying: 3 μm). Then the coating liquid used in Example 1 was applied to the surface of the adhesive layer and the coated layer was dried to obtain a masking film having a peelable, lightsafe layer (thickness: 40 μm) provided on the adhesive layer. The masking film exhibited light-blocking property similar to that of Example 1. The surface of the film was not sticky. The lightsafe layer exhibited good peelability. The lightsafe layer once peeled off permitted repeated use for resticking.

What is claimed is:

1. A lightsafe masking film comprising a transparent substrate, and a transparent, lightsafe layer peelably provided over one surface of said substrate and containing finely divided particles of $Fe_2O_3$ or $Fe_3O_4$ for blocking ultraviolet light and an organic yellow colorant.

2. A lightsafe masking film as claimed in claim 1, wherein said particles have an average particles size of 250 Å or less.

3. A lightsafe masking film as claimed in claim 1, wherein the content of said particles in said lightsafe layer is 2-20% by weight.

4. A lightsafe masking film as claimed in claim 1, further comprising a pressure sensitive adhesive layer provided between said substrate and said lightsafe layer.

5. A light safe masking film as claimed in claim 4, wherein said pressure sensitive adhesive layer comprises a synthetic resin adhesive or a rubber adhesive.

6. A light safe masking film as claimed in claim 4, wherein said lightsafe layer comprises a nitrile rubber, a nitrocellulose and a plasticizer.

7. A lightsafe masking film as claimed in claim 1, wherein said particles have an average particles size of 250 Å or less.

8. A lightsafe masking film as claimed in claim 4, wherein the content of said particles in said lightsafe layer is 2-20% by weight.

* * * * *